United States Patent
Park et al.

(10) Patent No.: US 6,274,920 B1
(45) Date of Patent: Aug. 14, 2001

(54) INTEGRATED INDUCTOR DEVICE AND METHOD FOR FABRICATING THE SAME

(75) Inventors: Min Park; Hyun-Kyu Yu; Cheon-Soo Kim; Chung-Hwan Kim; Dae-Yong Kim, all of Taejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 09/448,729

(22) Filed: Nov. 24, 1999

(30) Foreign Application Priority Data

Nov. 24, 1998 (KR) .................................................. 98-50417

(51) Int. Cl.$^7$ .................................................. H01L 29/00
(52) U.S. Cl. ............................................ 257/531; 257/277
(58) Field of Search ................................... 257/516, 528, 257/531, 533, 774, 513, 277

(56) References Cited

U.S. PATENT DOCUMENTS

| | | | |
|---|---|---|---|
| 5,450,263 | * 9/1995 | Desaigoudar et al. | ................ 360/110 |
| 5,539,241 | * 7/1996 | Abidi et al. | ........................... 257/531 |
| 5,770,509 | * 6/1998 | Yu et al. | ............................... 438/381 |
| 5,952,704 | * 9/1999 | Yu et al. | ............................... 257/531 |

* cited by examiner

Primary Examiner—David Nelms
Assistant Examiner—David Nhu
(74) Attorney, Agent, or Firm—Blakely Sokoloff Taylor & Zafman (57) ABSTRACT

A method for fabricating an inductor device includes the steps of forming a plurality of trenches in a substrate by selectively etching the substrate, implanting dopants into sidewalls and bottom portion of each trench, forming an oxide layer by oxidizing the trenches and the substrate and simultaneously forming a doped layer in the surroundings of the trenches by diffusing the dopants into the substrate, and forming a dielectric layer on a resultant structure to fill the entrance of the trenches, thereby forming air-gap layers inside the trenches, thereby reducing a parasitic capacitance and a magnetic coupling.

3 Claims, 10 Drawing Sheets

INTEGRATED INDUCTOR DEVICE AND METHOD FOR FABRICATING THE SAME

FIELD OF THE INVENTION

The present invention relates to integrated inductor devices; and, more particularly, to an integrated inductor device and a method for fabricating the same, in which a parasitic capacitance and a magnetic coupling can be reduced.

DESCRIPTION OF THE PRIOR ART

Generally, radio frequency integrated circuits (RF ICs) are designed to include an inductor for an impedance matching. The inductance and quality factor of the inductor are decisive factors for determining the performance of the matching circuit. Recently, it is possible to realize an integrated inductor (or, monolithic inductor) which is formed by integrating an inductor on a substrate, and accordingly, many researches into the integration of an active device and a matching circuit are actively underway. The performance of the integrated inductor, especially the quality factor is dependent on a substrate onto which the inductor is integrated and a capacitive coupling which is caused by the parasitic capacitance between the metal line for the inductor and the substrate. Specially, as the parasitic capacitance is increased, the quality factor will be lowered, which leads the result of the deterioration of the RF IC performance. Additionally, the quality factor will be lowered due to a magnetic coupling which is caused by an image current flowing on a lower portion of the substrate.

Currently, if passive devices, e.g., spiral inductors and capacitors, are formed on a gallium arsenide (GaAs) substrate and a silicon substrate in the form of integrated circuit, they can be influenced by the undesirable factors such as the parasitic capacitance and the magnetic coupling. Due to such undesirable factors, the quality factor of the spiral inductor and a self-resonance frequency ($f_{\omega 0}$) may be lowered. In order to solve the problem, the influence of the undesirable factors should be reduced.

As one approach for reducing the parasitic capacitance between the substrate and the metal line for the inductor, there has been provided a method for increasing the thickness of a dielectric layer between the metal line for the inductor and the substrate or a method for converting the substrate characteristic has been proposed. Additionally, until now, there are few methods for reducing the magnetic coupling, and it is impossible to measure how much apart the ground plane which can influence the inductor is located from the surface of the substrate. Therefore, it is also impossible to measure how much large area the magnetic coupling can influence.

Figure 1A:
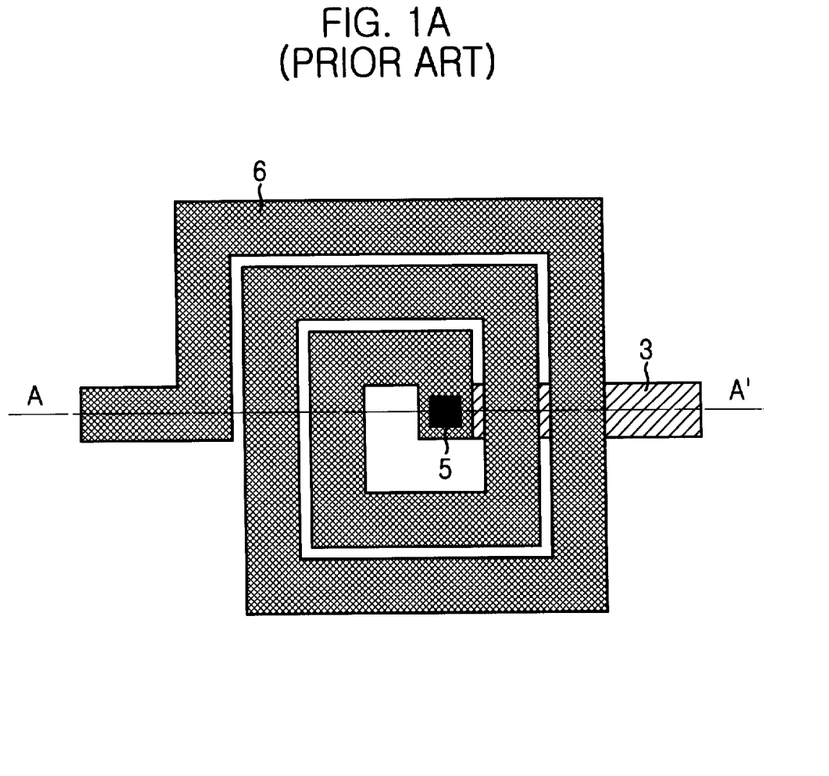
FIG. 1A is a plan view illustrating a conventional inductor device.
Figure 1B:
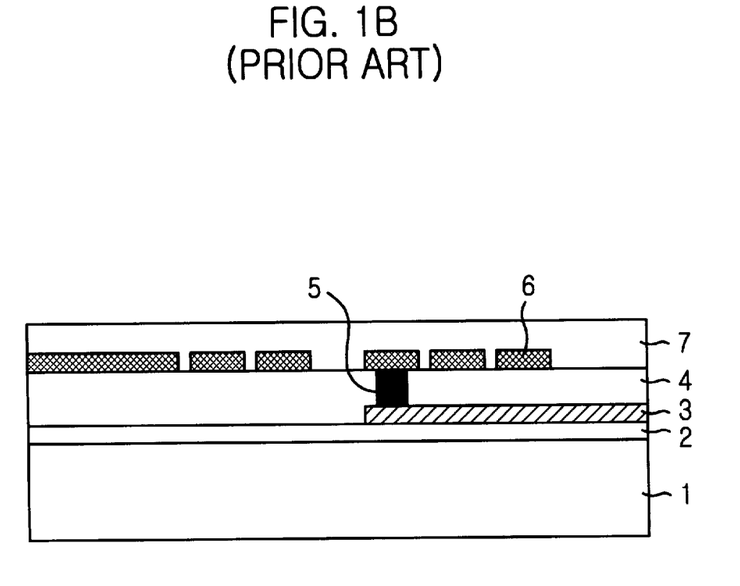
FIG. 1B is a cross-sectional view showing the conventional device taken along a line A-A' as shown in FIG. 1A.

FIG. 1A shows a plane view of a conventional inductor device. As shown in FIG. 1A, the inductor includes a second metal line 6 which has a square shape and is connected to the first metal line 3 through a via hole 5. FIG. 1B shows a cross-sectional view of the inductor device along the line A-A' in FIG. 1A. As can be seen, the conventional inductor includes a first interlayer dielectric layer 2 formed on a silicon substrate 1. The first metal line 3 is connected to the second metal line 6 for the inductor through the via hole 5 formed in a second interlayer dielectric layer 4. A reference numeral 7 indicates a passivation layer for protecting the inductor device.

In such a construction shown in FIGS. 1A and 1B, the parasitic capacitance is determined by the distance between the substrate 1 and the second metal line 6, i.e., the thickness of the interlayer dielectric layers 2 and 4. Since there is a limit to the increase of the thickness, however, it is very difficult to decrease the parasitic capacitance.

SUMMARY OF THE INVENTION

It is, therefore, an object of the present invention to provide an integrated inductor device and a method for fabricating the same, in which a parasitic capacitance and a magnetic coupling can be reduced an integrated device.

In accordance with an aspect of the present invention, there is provided a method for fabricating an inductor device, comprising the steps of: a) forming a plurality of trenches in a substrate by selectively etching the substrate; b) implanting dopants into sidewalls and bottom portion of each trench; c) forming an oxide layer by oxidizing the trenches and the substrate and simultaneously forming a doped layer on a region neighboring to the substrate by diffusing the dopants into the substrate; and d) forming a dielectric layer on the resultant structure to fill the entrance of the trenches, thereby forming air-gap layers in the trenches.

In accordance with another aspect of the present invention, there is provided an integrated inductor device which is formed by integrating an inductor on a substrate, comprising; a trench structure formed in the substrate; a dielectric layer formed on the resultant structure, so that an entrance of the trench structure is filled to thereby form an air gap layer between the trench structure and the dielectric layer; a doped layer formed in a region neighboring to the trench structure; an contact hole for exposing the doped layer; and an electrode, wherein the electrode is connected to the doped layer through the contract hole.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 2A:
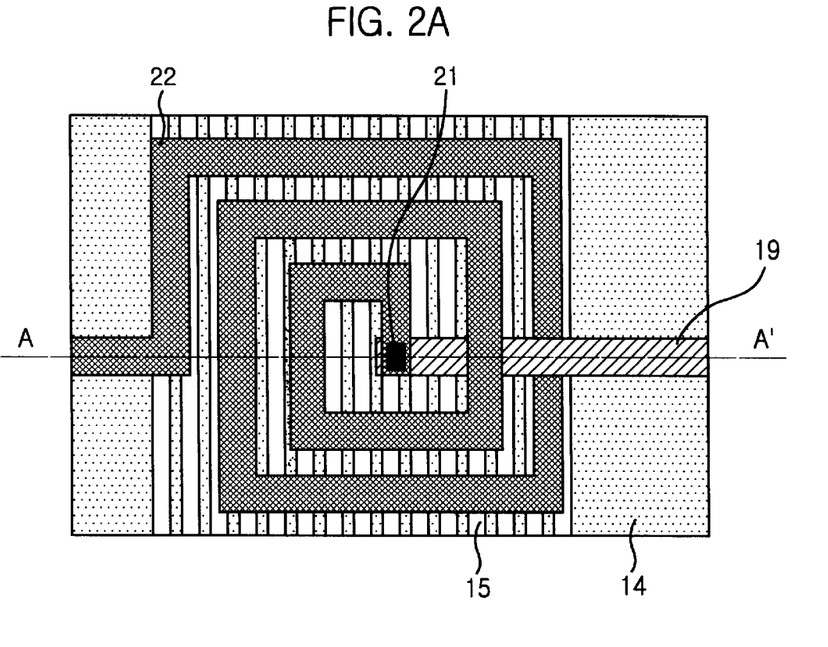
FIG. 2A is a plan view of an inductor device in accordance with a first preferred embodiment of the present invention.
Figure 2B:
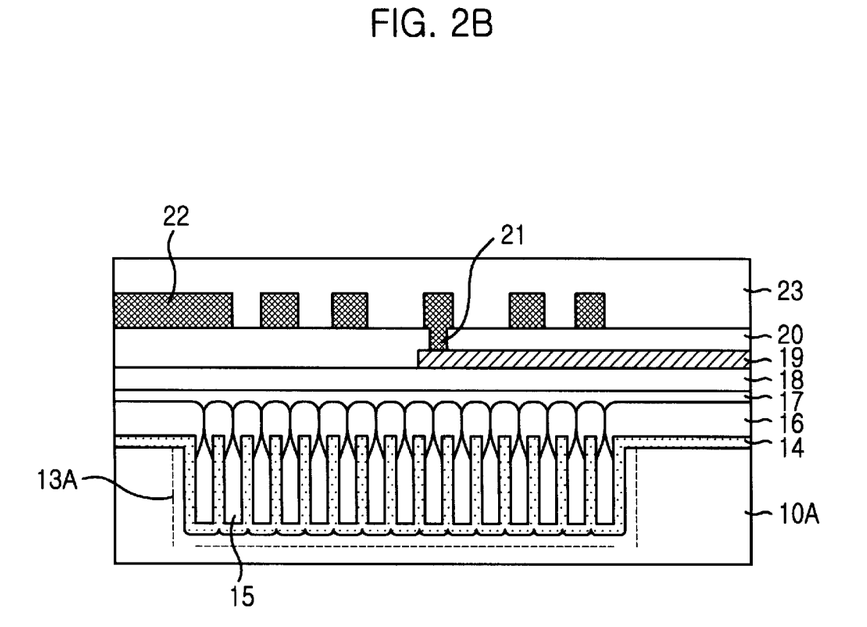
FIG. 2B is a cross-sectional view showing the inductor device taken along a line A-A' as shown in FIG. 2A.

FIG. 2 is a plane view of the inductor device in accordance with a first preferred embodiment of the present invention. FIG. 2B is a cross-sectional view along the line A—A; in FIG. 2A.

Referring to FIGS. 2A and 2B, the inductor device includes a second metal wire 22 for the inductor having a spiral form, a plurality of trenches, whose sidewalls and bottom portion are made up of an oxide layer 14. A doped layer 13A is formed in the surroundings of the trenches, wherein a conductivity type of the doped layer 13A is opposite to that of the substrate 10A. Each trench entrance is filled with a first interlayer dielectric layer 16, which leads the result of the formation of air-gap layers 15 inside each trench. After a second interlayer dielectric layer 17 is formed with a spin on glass (SOG) layer for the planarization of the first interlayer dielectric layer 16, a third interlayer dielectric layer 18, a first metal line 19, a fourth interlayer dielectric layer 20 and a via hole 21 are sequentially formed on the second interlayer dielectric layer 17. The first metal line 19 is connected to the second metal line 22 through the via hole 21 which is formed in the fourth interlayer dielectric layer 20. A reference numeral 23 indicates a passivation layer 23 for protecting the inductor device. For the sake of simplicity in the drawing, the first, second, third and fourth dielectric layers and the passivation layer are omitted in FIG. 2A.

FIGS. 3A to 3I is cross-sectional views illustrating the steps of the method for fabricating the inductor device shown in FIGS. 2A and 2B.

Figure 3A:
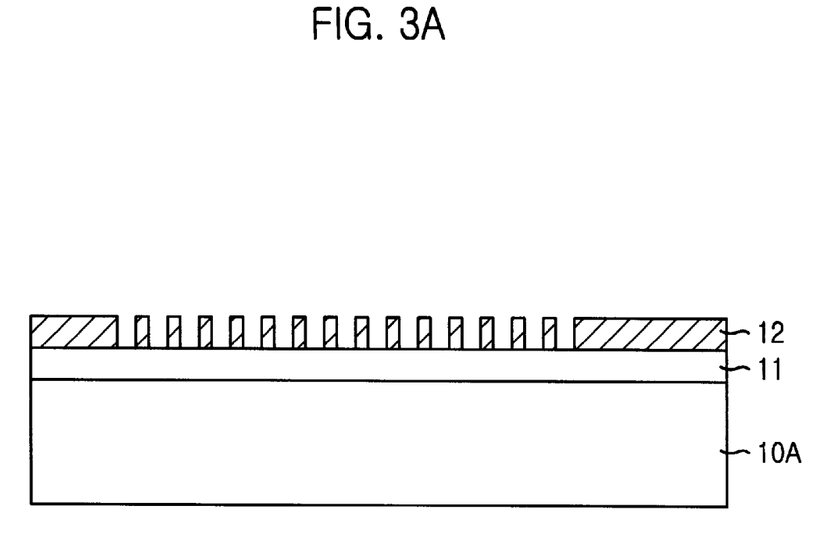
FIGS. 3A to 3I are cross-sectional views illustrating the steps a method of fabrication an inductor device as shown in FIGS. 3A and 3B.

Referring to FIG. 3A, an insulating layer 11 is formed on a P-type (or, N-type) silicon substrate 10A. The insulating layer 11 serves as a mask when forming a trench by a dry etching. Accordingly, the insulating layer 11 can be preferably formed with materials, whose etching selectivity is greatly difference form that of the silicon substrate 10A. In the present invention, the etching selectivity of the insulating layer 11 to the substrate 10A is 17:1. That is, the silicon substrate 11A is etched 17 times as fast as the insulating layer 11 during the etching process for forming the trench. Next, a photoresists 12 are formed on predetermined regions of the insulating layer 11, wherein the predetermined regions are overlapped with the inductor metal line and defines a region to form a plurality of trenches at following process.

Figure 3B:
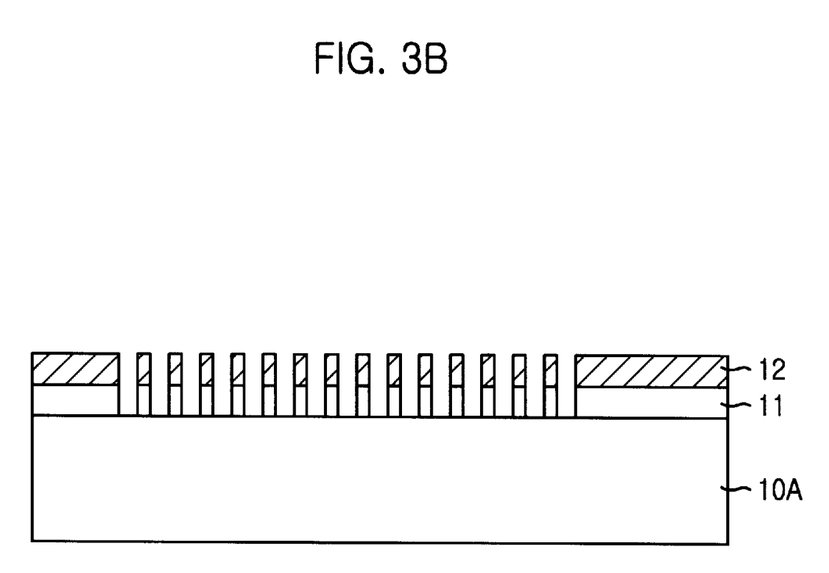

Referring to FIG. 3B, the insulating layer 11 is selectively etched to expose the silicon substrate 10A by a dry or wet etching process using the photoresists 12 as an etching mask.

Figure 3C:
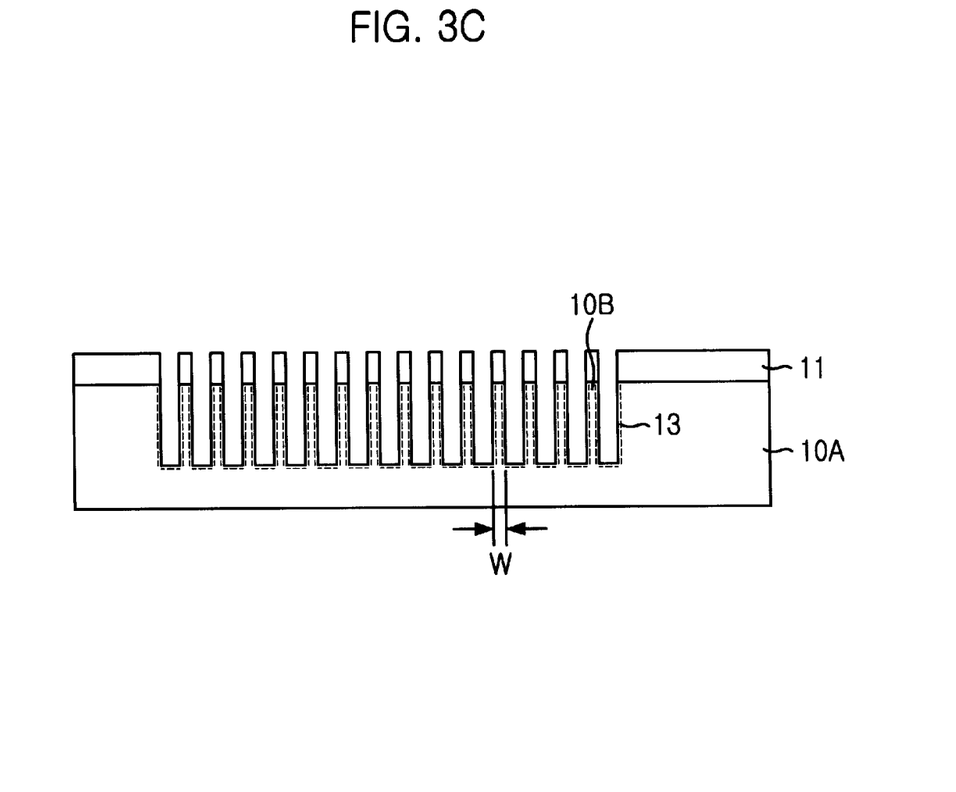

Referring to FIG. 3C, a dry etching process using both the photoresists and the insulating layer 11 as an etching mask is performed to form a plurality of trenches. At this time, the dry etching process is performed in an atmosphere containing a mixed gas such as HBr, $NF_3$, $SiF_4$ and $H_2O_2$ on conditions that a chamber pressure is of 100 to 200 mTorr, a RF power is of 300 to 500 W, and a magnetic field is of 80 to 100 Gauss. In such an etching condition, an etching rate of the silicon substrate 10A is about 9000 Å/min. Since the etching selectivity is excellent, it is possible to form the trenches having a desired depth. The width (W) of silicon substrate 10B which constitutes the trenches is about 0.5 $\mu$m to 2.0 $\mu$m. Sequentially, the photoresists 12 is removed from the resultant structure and a doped layer 13 is formed in the surroundings of the trenches by implanting dopants of the conductivity type, which is the opposite conductivity type to that of the substrate 10A. At this time, in case of P-type substrate $POCL_3$ is used as the dopants. For effectively implanting the dopants into the trenches having a narrow width, the implantation process is performed at a high temperature using an apparatus, for example, a furnace.

Figure 3D:
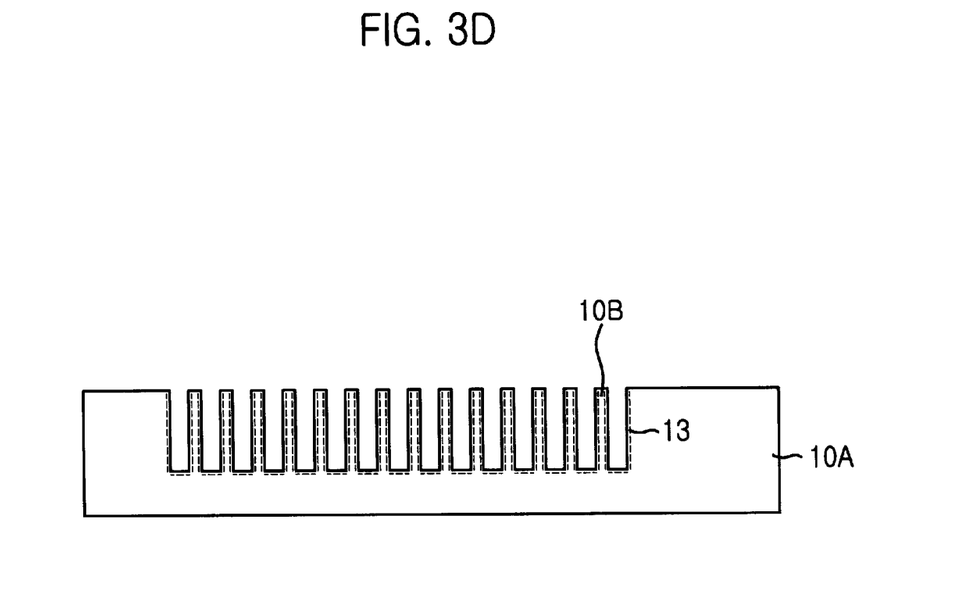

Referring to FIG. 3D, the insulating layer 11 is removed.

Figure 3E:
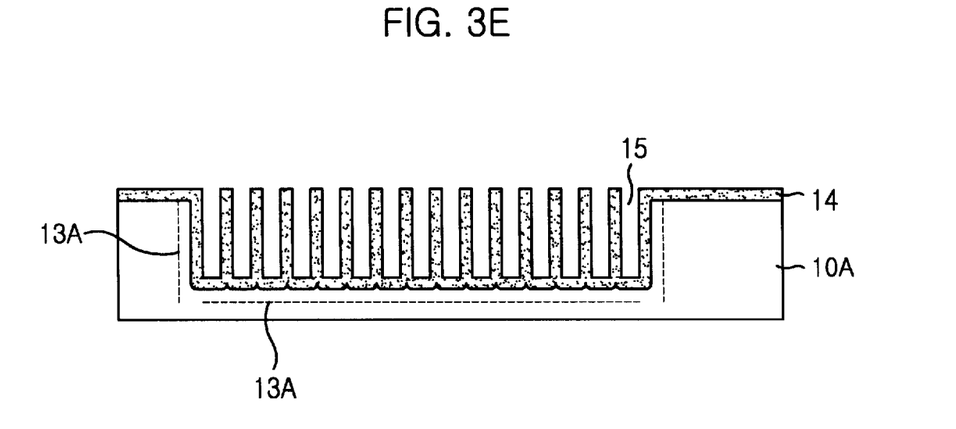

Referring to FIG. 3E, an oxide layer 14 is formed by a wet oxidation of the silicon substrate 10A and 10B. At this time, the wet oxidation is performed at a temperature of 900° C. to 1100° C. in a furnace maintaining a $H_2/O_2$ atmosphere. The silicon substrate 10A and 10B is oxidized up to 45% to 50% during the wet oxidation, therefore, it is very important to control the width (W) of the silicon substrates 10B, which constitute the trenches, in order to wholly oxidize the surroundings to the trenches. In case where the width of the silicon substrate 10B is about 1.0 $\mu$m and the thickness of the oxide layer 14 is about 1.2 $\mu$m, the silicon substrate 10B is wholly oxidized to become the oxide layer. Through such an oxidation of the silicon substrate 10A and 10B, the inductor characteristic can be prevented from deterioration due to the substrate loss caused in the lower portion of the inductor.

Meanwhile, since the wet oxidation is performed at a high temperature, the dopants in the doped layer 13 is activated and diffused into the silicon substrate 10A, resulting in the increase of the thickness of the doped layer 13. A reference numeral 13A indicates the doped layer having an increased thickness.

Figure 3F:
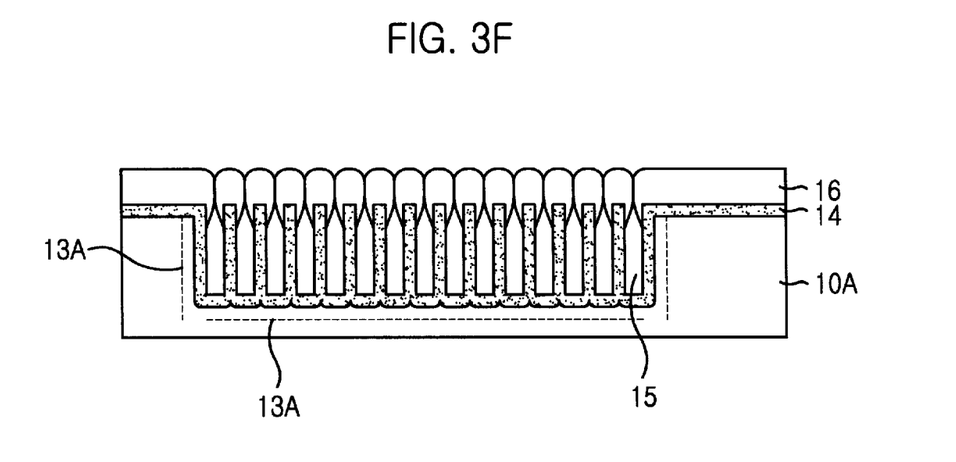

Referring to FIG. 3F, a first interlayer dielectric layer 16 is formed on the oxide layer 14, so that each entrance of the trenches is filled with the first interlayer dielectric layer 16, which leads the result of the formation of air-gap layers 15 inside each trench. At this time, the first interlayer dielectric layer 16 is formed by a reaction of, e.g., $SiH_4$ and $O_2$ using a PECVD (plasma enhanced chemical vapor deposition) method. The dielectric layer formed by PECVD method has poor step coverage. Therefore, if the first interlayer dielectric layer 16 is deposited to over a predetermined thickness, each entrance of the trenches is filled to form an air gap layers 15 inside the trenches before the inside of the trenches are filled.

Figure 3G:
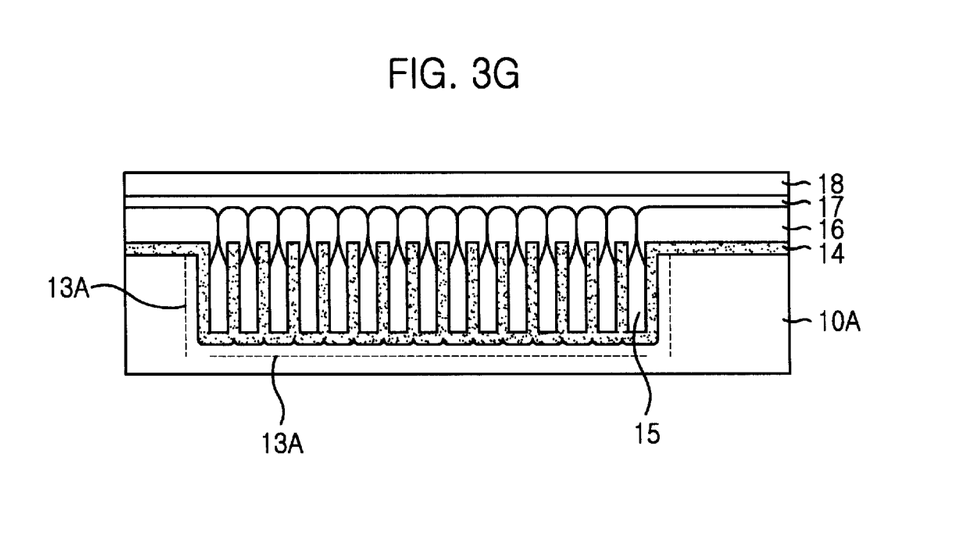

Referring to FIG. 3G, for the planarization to the first interlayer dielectric layer 16, a second interlayer dielectric layer 17 is formed on the first interlayer dielectric layer 16 by coating a SOG (spin on glass) layer and performing a thermal treatment thereto. Then, a third dielectric layer 18 is deposited on the second interlayer dielectric layer 17 by a PECVD method, so that a lower portion of the inductor is planarized.

Figure 3H:
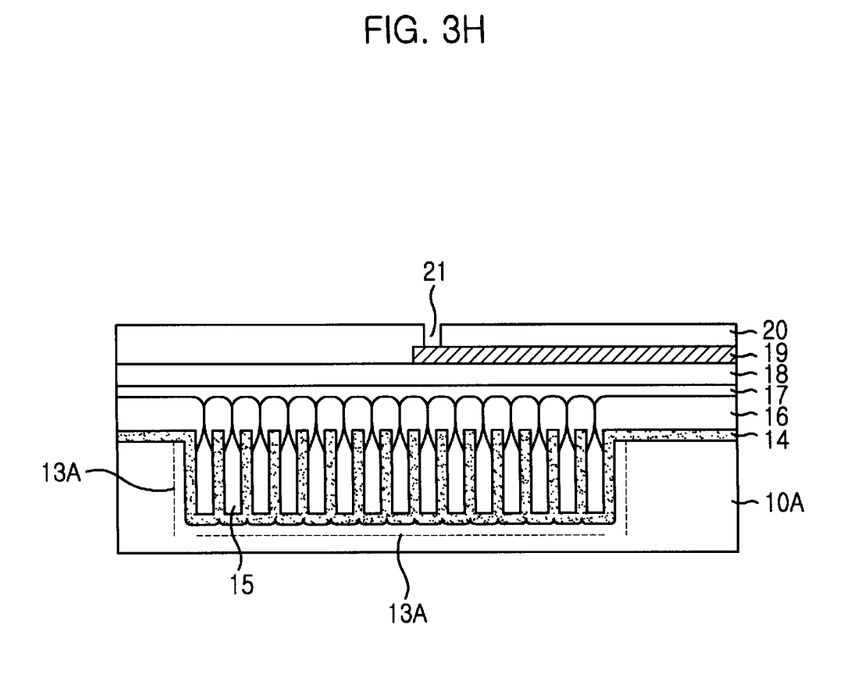

Referring to FIG. 3H, a first metal line 19 is formed on the third interlayer dielectric layer 18 and a fourth dielectric layer 20 is formed on the resultant structure by a stacked structure of $SiO_2/SOG/SiO_2$ layer. Then, by selectively etching the fourth interlayer dielectric layer 20, a via hole 21 exposing the first metal line 19 is formed.

Figure 3I:
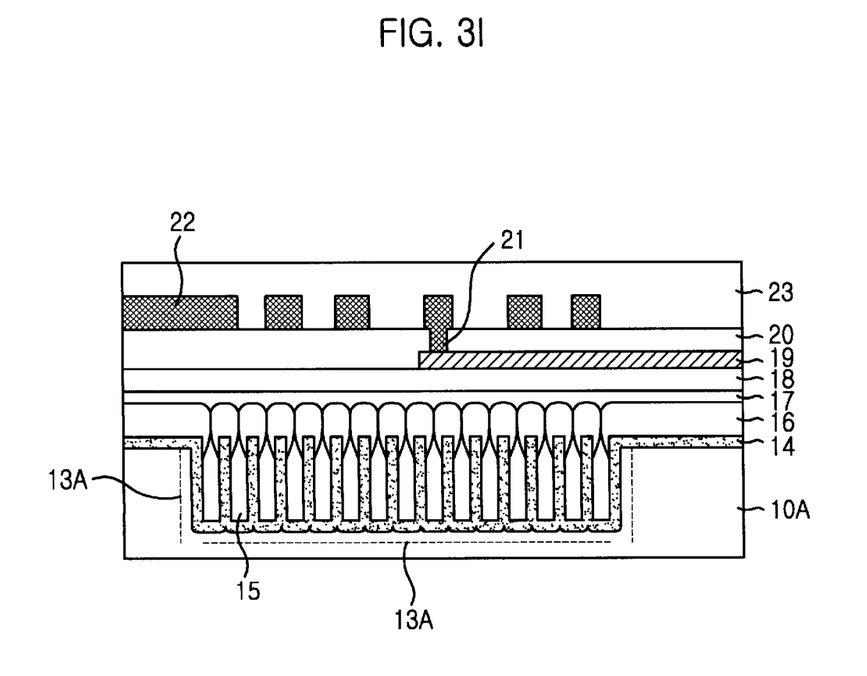

Referring to FIG. 3I, a second metal line 22 is formed in a spiral form on the fourth interlayer dielectric layer 20 and is connected to the first metal line 19 through the via hole 21. Then, a passivation layer 23 is formed on the resultant structure.

As mentioned above, by forming the air gap layers 15 in the direction perpendicular to the region overlapping with the inductor and the doped layer 13A having a conductivity type opposite to that of the substrate, the parasitic capacitance due to the substrate loss is remarkably reduced. Thus, the capacitive coupling can be effectively prevented.

Furthermore, by forming the air-gap layers 15 in a direction perpendicular to the second metal line for the inductor, the magnetic coupling, which is induced by the image current flowing on the lower portion of the inductor, can be also prevented.

Figure 4A:
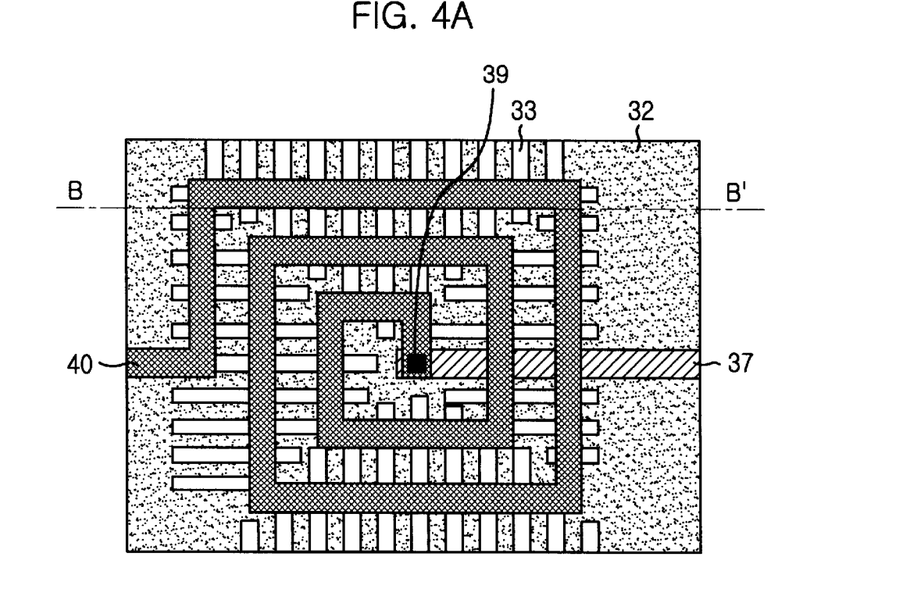
FIG. 4A is a plan view of an inductor device in accordance with a second preferred embodiment of the present invention.
Figure 4B:
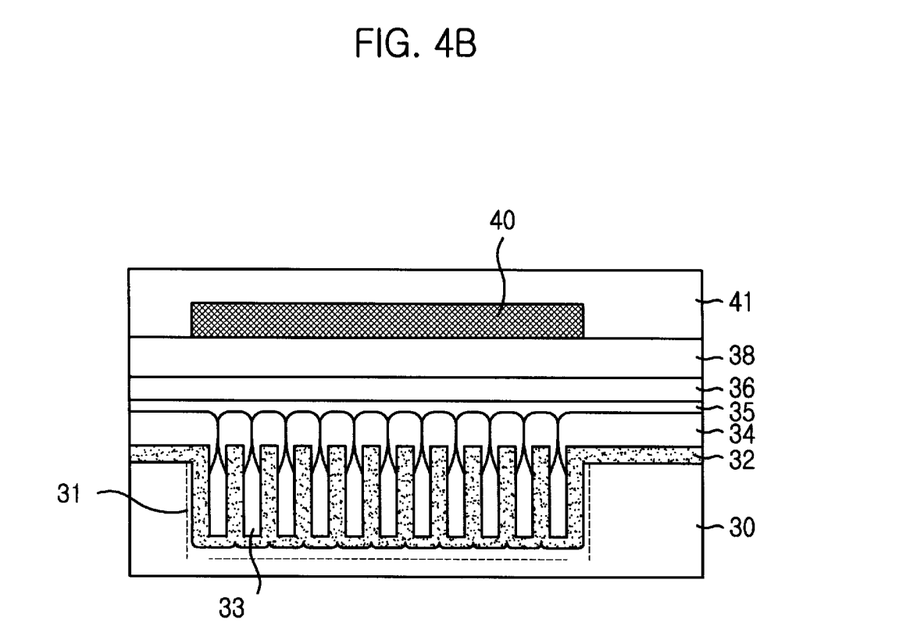
FIG. 4B is a cross-sectional view illustrating the inductor device taken along a line B-B' as shown in FIG. 4A.

FIG. 4A is a plane view of an inductor in accordance with a second preferred embodiment of the present invention. FIG. 4B is a cross-sectional view along the line B-B' in FIG. 4A.

Referring to FIGS. 4A and 4B, an oxide layer 32 is formed in the surroundings of a region which is overlapped with a second metal line 40 for the inductor. A plurality of trenches are formed in the substrate 30, whose length direction is perpendicular to the width direction of the second metal line 40. A doped layer 31 having a conductivity type opposite to that of the substrate 30 is formed in the surroundings of the trenches. Each entrance of the trenches is filled with a first interlayer dielectric layer 34 to thereby form air-gap layers 33 inside each trench. A second interlayer dielectric layer 35 is formed on the first interlayer dielectric layer 34 by coating a SOG (spin on glass) layer and performing a thermal treatment thereto. Then, a third interlayer dielectric layer 36 is formed with a stacked $SiO_2/SOG/SiO_2$ layer. A first metal line 37, a fourth interlayer dielectric layer 38 and a via hole 39 are formed. The first metal line 37 is connected to the second metal line 40 for the spiral inductor through the via hole 39 formed in the fourth interlayer dielectric layer 38. A reference numeral 41 indicates a passivation layer for protecting the inductor device. For the sake of simplicity in the drawing, the first, second, third and fourth dielectric layers and the passivation layer are omitted in FIG. 4A.

As described in an embodiment of the present invention, by forming the air-gap layers 33 in the direction perpendicular to the region overlapping with the inductor and the doped layer 31 having a conductivity type opposite to that of the substrate, the parasitic capacitance due to the substrate loss is remarkably reduced. Thus, the capacitive coupling can be effectively prevented.

Furthermore, since respective portions of the second metal line 40 are perpendicular to the air gap layer 33 and the doped layer 31, respectively, the magnetic coupling induced by the image current flowing on the lower portion of the inductor can be effectively prevented.

Figure 5A:
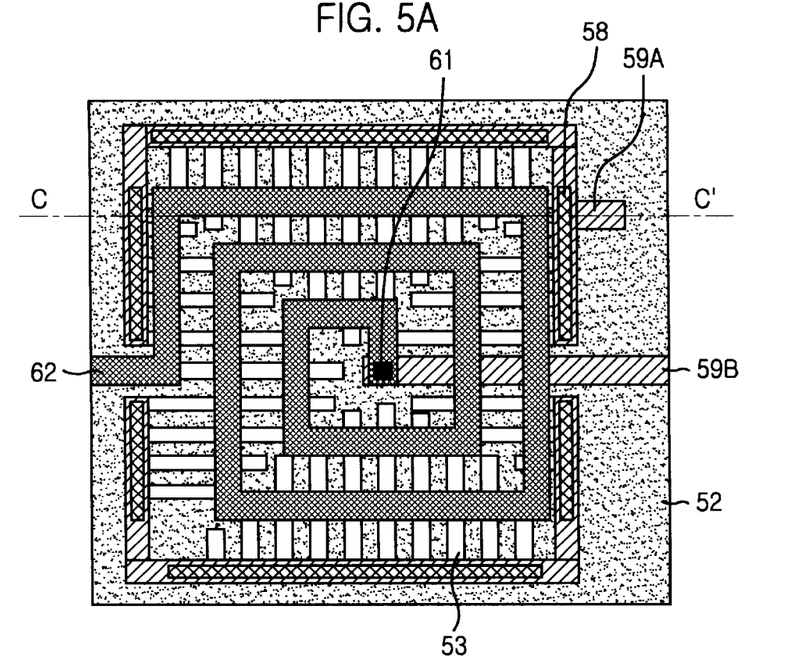
FIG. 5A is a plan view of an inductor device n accordance with a third preferred embodiment of the present invention.
Figure 5B:
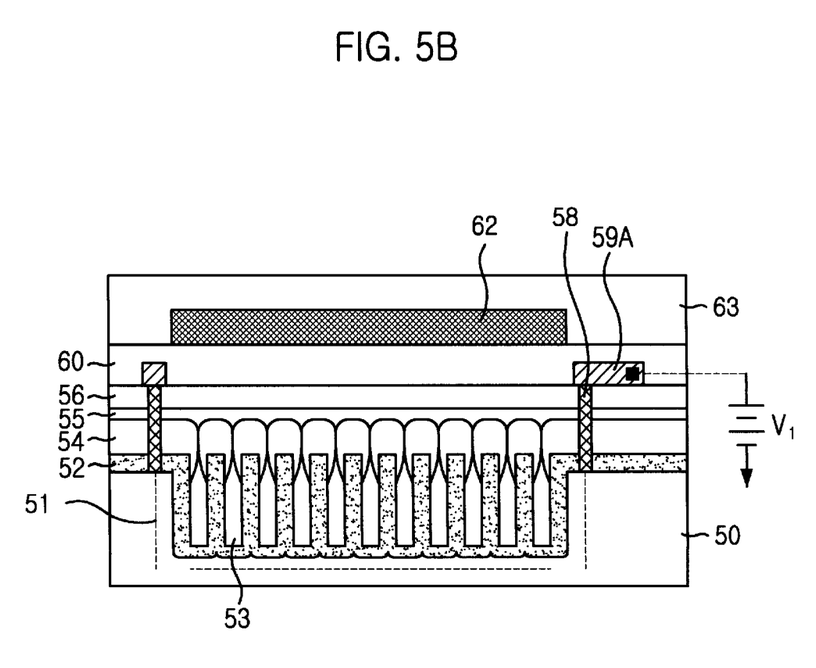
FIG. 5B is a cross-sectional view showing the inductor device taken along a line C-C' as shown in FIG. 5A.

FIG. 5 is a plan view of the inductor device in accordance with a third preferred embodiment of the present invention. And FIG. 5B is a cross-sectional view along the line C-C' in FIG. 5A.

Referring to FIGS. 5A and 5B, an oxide layer 52 is formed in the surroundings of a region which is overlapped with a second metal line 62 for the inductor. A plurality of trenches are formed in the substrate 50, whose length direction is perpendicular to the width direction of the second metal line 62. A doped layer 51 having a conductivity type opposite to that of the substrate 50 is formed in the surroundings of the trenches. Each entrance of the trenches is filled with a first interlayer dielectric layer 54 to thereby form air-gap layers 53 inside each trench. A second interlayer dielectric layer 55 is formed on the first interlayer dielectric layer 54 by coating a SOG (spin on glass) layer and performing a thermal treatment thereto. Then, a third interlayer dielectric layer 56 is formed with a stacked $SiO_2/SOG/SiO_2$ layer. Then, a third interlayer dielectric layer 56, the second interlayer dielectric layer 55 and the first interlayer dielectric layer 54 are selectively etched to form a contact hole which exposes the doped layer 51 formed on the surface of the silicon substrate 50. A trench electrode 58 is connected to the doped layer 51 through the contact hole. A first metal line 59B and a power line 59A through which a predetermined voltage $V_1$ is applied to the trench electrode 58 are formed. Then, the fourth dielectric layer 60 is formed and selectively etched to form a via hole 61 exposing the first metal line 59B. The first metal line 59B is connected to the second metal line 62 through the via hole 61. A reference numeral 63 indicates a passivation layer for protecting the inductor device. For the sake of simplicity in the drawing, the first, second, third and fourth dielectric layers and the passivation layer are omitted in FIG. 5A.

The method for fabricating the inductor device in accordance with the third preferred embodiment of the present invention will be described in detail with reference to FIGS. 6A and 6B.

Figure 6A:
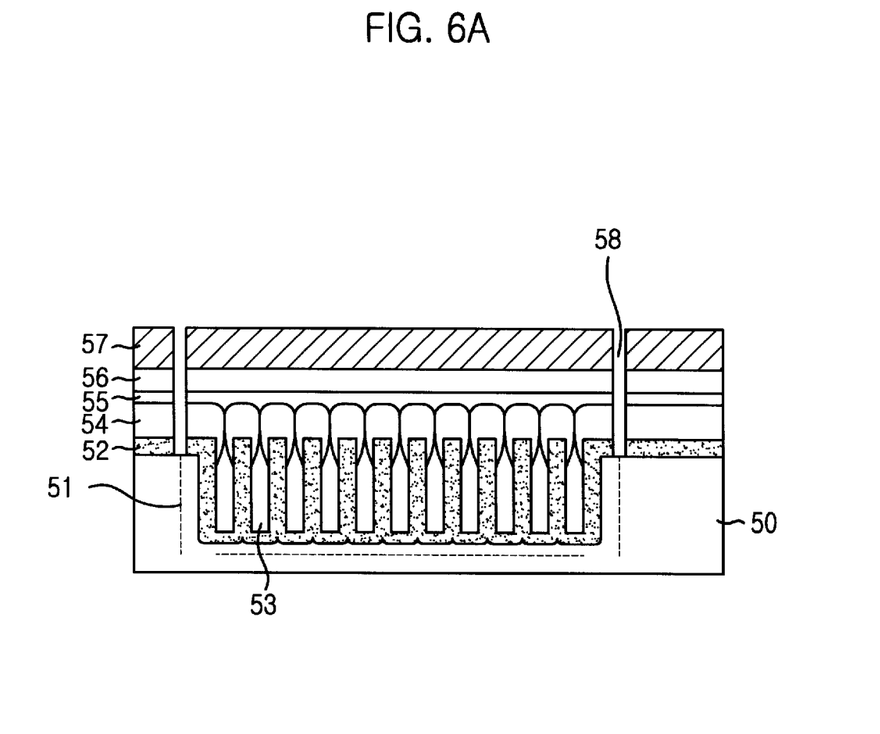
FIGS. 6A and 6B are cross-sectional views depicting in detail the steps of a method for fabricating the inductor device of the third preferred embodiment of the present invention taken along the line C-C' as shown in FIG. 5A.

Referring to FIG. 6A, predetermined portions of the silicon substrate 50 which are overlapped with the inductor having a spiral form is selectively etched to form a plurality of the trenches, wherein the length direction of the trenches is perpendicular to the width direction of the second metal line 62. A doped layer 51 is formed in the surroundings of the trenches by implanting dopants of the conductivity type, which is opposite to that of the substrate 50. Next, an oxidation is performed to form the oxide layer 52 in the surroundings of each trench. Then, each entrance of the trenches is filled with the first interlayer dielectric layer 54 to thereby form the air-gap layers 53 inside each trench. A second interlayer dielectric layer 55 is formed on the first interlayer dielectric layer 54 and a third interlayer dielectric layer 56 is formed with a stacked $SiO_2/SOG/SiO_2$ layer. Consequently, the photoresists 57 are formed in predetermined regions of the third dielectric layer 56, wherein the predetermined regions defines the trench electrode to be formed. The contact hole exposing the surface of the silicon substrate 50 is formed by etching the third, second and first interlayer dielectric 56, 55 and 54, respectively, using the photoresists 57 as an etching mask.

Figure 6B:
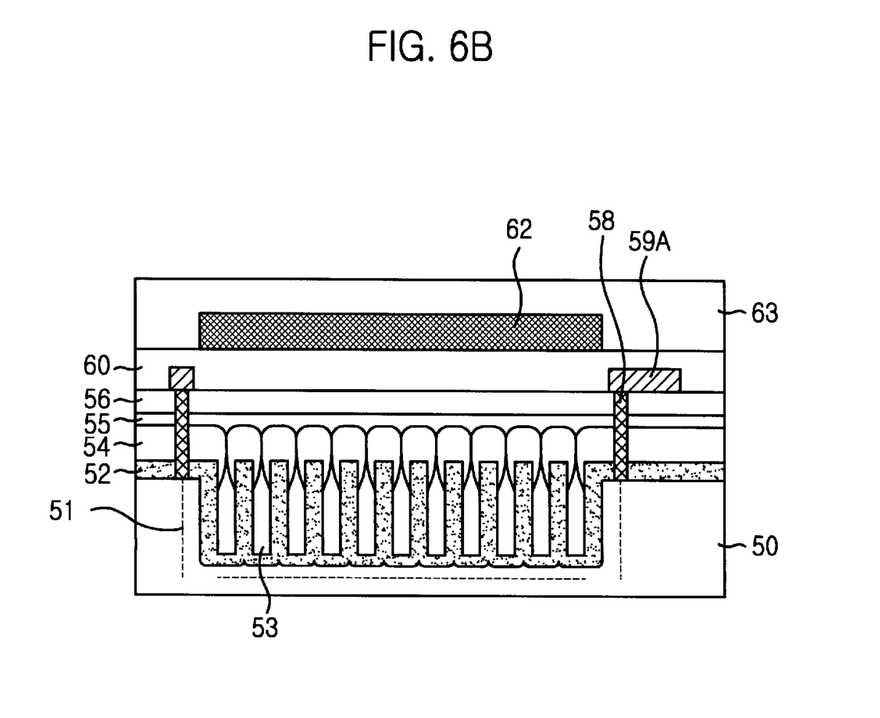

Referring to FIG. 6B, the first metal line 59B is formed on the third interlayer dielectric layer 56. At this time, a trench electrode 58 and a power line 59A are simultaneously formed, wherein a predetermined voltage $V_1$ is applied to the trench electrode 58 through the power line 59A. Additionally, the trench electrode 58 is connected to the doped layer 51 through the contact hole. The fourth dielectric layer 60 is formed and then etched to form the via hole exposing the first metal line 59B. The first metal line 59B is connected to the second metal line 62 through the via hole, thereby forming the inductor. Then, the passivation layer 63 is formed on the resultant structure.

As described above, the magnetic coupling which is induced by the image current flowing on the lower portion of the inductor can be effectively prevented since respective portion of the second metal line 62 is perpendicular to the air-gap layers 53 and the doped layer 51, respectively. Furthermore, a depletion region is formed at a large depth in the substrate 50 by applying a voltage to the doped layer 51 through the trench electrode 58.

Figure 7:
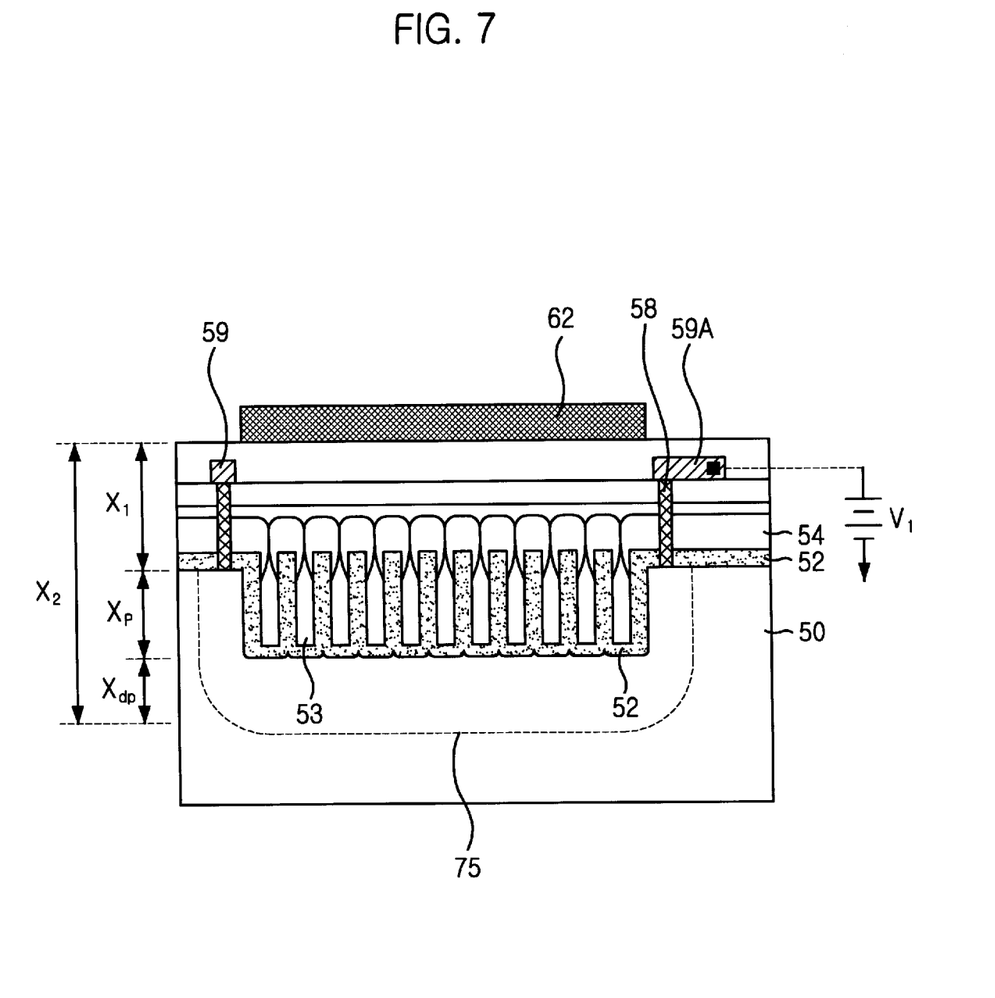
FIG. 7 is a cross-sectional view representing a depletion layer of the third preferred embodiment of the present invention when a reverse voltage is applied to a trench electrode.

FIG. 7 is a cross-sectional view representing a depletion layer of the third preferred embodiment of the present invention when a reverse voltage is applied to the trench electrode.

In case of P-type substrate, if a reverse bias voltage $V_1$ is applied to the trench electrode 58 which is connected to the doped layer 51, a depletion region 75 having a predetermined depth $X_{dp}$ is formed in the silicon substrate 50. The parasitic capacitance is determined only by a depth $X_1$ extending from the surface of the substrate 50 to the second metal line 62 according to the prior art. On the other hand, the inductor device according to the present invention can reduce the parasitic capacitance as the depth $X_p$ of the air-gap layers 53 is increased. Additionally, if the reverse voltage is applied to the trench electrode 58, the depletion layer 75 is formed, so that the parasitic capacitance can be reduced as much as the depth $X_{dp}$ of the depletion region. As a result, the parasitic capacitance of the inductor device according to the present invention is determined by the total depth $X_2$ corresponding to the sum of the depth $x_1$, the depth $X_p$ and the depth $X_{dp}$.

Accordingly, as the depth of the trench becomes deeper, the capacitive coupling and the magnetic coupling are remarkably decreased.

While the present invention has been described with respect to certain preferred embodiments only, other modifications and variation may be made without departing from the spirit and scope of the present invention as set forth in the following claims.

What is claimed is:

1. An integrated inductor device which is formed by integrating an inductor on a substrate, comprising:

plurality of trench structures formed in a substrate;

dielectric layer formed on the resultant structure wherein entrances of the trench structure are filled to form air gaps between each of the trench structures and the dielectric layer;

doped layer formed in the surroundings of the trench structures;

contact hole for exposing the doped layer;

an electrode for connecting to the doped layer through the contact hole; and a metal line formed on an upper portion of the trench structures, wherein a length direction of each trench is perpendicular to a width direction of a corresponding portion of the metal line.

2. The integrated inductor device as recited in claim 1, wherein the trench structure is in a form of spiral.

3. The integrated inductor devcei as recited in claim 2, wherein an oxide layer is formed on the surroundings of the trench structures.

* * * * *